United States Patent
Jain et al.

(10) Patent No.: US 7,297,605 B2
(45) Date of Patent: Nov. 20, 2007

(54) SOURCE/DRAIN EXTENSION IMPLANT PROCESS FOR USE WITH SHORT TIME ANNEALS

(75) Inventors: Amitabh Jain, Allen, TX (US); Gordon Pollack, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 193 days.

(21) Appl. No.: 10/842,308

(22) Filed: May 10, 2004

(65) Prior Publication Data

US 2005/0250288 A1    Nov. 10, 2005

(51) Int. Cl.
  *H01L 21/336* (2006.01)
  *H01L 21/425* (2006.01)
(52) U.S. Cl. ............... 438/299; 438/514; 257/E21.598
(58) Field of Classification Search ......... 438/197, 438/299, 301, 302, 303, 305, 306, 514, 525, 438/527; 257/E21.598, E21.619, E21.62, 257/E21.634, E21.668
See application file for complete search history.

(56) References Cited

U.S. PATENT DOCUMENTS 5,486,712 A * 1/1996 Arima .................. 257/296
6,187,643 B1   2/2001 Borland
6,297,098 B1 * 10/2001 Lin et al. ............... 438/264
2004/0137687 A1 * 7/2004 Feudel et al. ........... 438/302

* cited by examiner

Primary Examiner—Scott B. Geyer
(74) Attorney, Agent, or Firm—Rose Alyssa Keagy; W. James Brady; Frederick J. Telecky, Jr.

(57) ABSTRACT

The present invention provides, in one embodiment, a process for fabricating a metal oxide semiconductor (MOS) device (100). The process includes forming a gate (120) on a substrate (105) and forming a source/drain extension (160) in the substrate (105). Forming the source/drain extension (160) comprises an abnormal-angled dopant implantation (135) and a dopant implantation (145). The abnormal-angled dopant implantation (135) uses a first acceleration energy and tilt angle of greater than about zero degrees. The dopant implantation (145) uses a second acceleration energy that is higher than the first acceleration energy. The process also includes performing an ultrahigh high temperature anneal of the substrate (105), wherein a portion (170) of the source/drain extension (160) is under the gate (120).

13 Claims, 5 Drawing Sheets

SOURCE/DRAIN EXTENSION IMPLANT PROCESS FOR USE WITH SHORT TIME ANNEALS

TECHNICAL FIELD OF THE INVENTION

The present invention is directed in general to the manufacture of a semiconductor device and, more specifically, to the fabrication of a source/drain extension.

BACKGROUND OF THE INVENTION

There is a continuing push to produce smaller semiconductor devices with lower power consumption and faster switching speeds. With device miniaturization, however, comes a number of new design problems. In particular, as new technologies are implemented to produce smaller device components, there is a need to retain compatibility with other components still being produced by older technologies.

For instance, consider the efforts to scale-down a metal oxide semiconductor (MOS) device. Scaling down the gate length, in addition to increasing device packing density, also facilitates the use of lower voltages and the faster operation of a field effect transistor (FET). Scaling down the gate, however, tends to increase the transistor's leakage current in the off-state. One approach to reduce the leakage current is to form a shallow source/drain extension immediately next to the gate and near the substrate's surface and the channel region. The source/drain extensions, as well understood by those skilled in the art, act as extensions of the more heavily doped source and drain region. The source/drain extensions are also widely referred to as shallow junctions or lightly doped drains (LDD).

Unfortunately, a conventionally-formed, and therefore conventionally-sized source/drain extension, used with a scaled-down gate does not necessarily cure the leakage current problem. A conventionally-sized drain extension can undesirably generate an electrical field that is sufficient to lower the gate threshold voltage and cause drain-induced barrier lowering (DIBL). The gate threshold voltage is reduced because the electric field from the drain penetrates into the channel and acts oppositely to the gate's electric field. DIBL occurs when the electric field from the drain reaches the source, thereby lowering the energy barrier to inject carriers into the channel.

Consequently, it is necessary to also scale-down the source/drain extension to reduce the strength of the electric field generated by the drain. Moreover, it is important to be able to scale down the dimensions of the source/drain extension in proportion to the degree of reduction in gate length. Source/drain extension can be scaled-down by using low dopant implant energies in combination with rapid or spike thermal annealing. The use of increasingly shorter thermal anneal times to provide smaller source/drain dimensions as devices are continuously scaled down, has been problematic, however.

As the duration of the annealing time is reduced, the dopant of the source/drain extension diffuses substantially shorter distances. This advantageously minimizes the depth of the source/drain extension in the substrate and produces extensions having a well-defined border, as exemplified by an abrupt decrease in dopant concentration in transitioning from the extension to substrate. An abrupt border is desirable as this supports the low-voltage operation of transistor devices and better defines the width of the channel region. Unfortunately, short anneal times also limit the extent to which implanted dopants of the source/drain extension diffuse under the gate.

It is desirable to form the source/drain extension such that it overlaps with the gate because this facilitates the electric field generated by the gate to cause majority carriers to accumulate in the border of the source/drain extension. The accumulation of majority carriers, in turn, helps mitigate the increased resistance associated with lower dopant concentrations in the border of the extension. High resistance in the border of the source/drain extension is undesirable because this reduces the transistor's on-state current.

Therefore there is need for an improved method to manufacture scaled-down source/drain extensions in semiconductor devices that avoid the above-mentioned limitations.

SUMMARY OF THE INVENTION

To address the above-discussed deficiencies of the prior art, the present invention provides a process for fabricating a metal oxide semiconductor (MOS) device. The process includes forming a gate on a substrate and forming a source/drain extension in the substrate. Forming the source/drain extension includes an abnormal-angled dopant implantation process, using a first acceleration energy and tilt angle of greater than about zero degrees. There is also a dopant implantation using a second acceleration energy that is higher than the first acceleration energy. In addition, an ultrahigh high temperature anneal of the substrate is performed, wherein a portion of the source/drain extension is under the gate.

In another embodiment, the present invention provides a MOS device. The MOS device comprises a substrate having a top surface, a gate structure on the top surface and a source/drain extension in the silicon substrate. A portion of the source/drain extension is under the gate. The source/drain extension has a border at a depth of less than about 25 nanometers from the top surface of the substrate. The border is defined to occur when there is a decrease in dopant concentration, corresponding to an abruptness of less than about 30 Angstroms/decade.

Yet another embodiment of the present invention is a method of manufacturing an integrated circuit. The method includes forming MOS transistors using the above-described process. The method further includes interconnecting metal lines on one of more insulating layers located over the MOS transistors and interconnecting the MOS transistors to form an operative integrated circuit.

The foregoing has outlined preferred and alternative features of the present invention so that those of ordinary skill in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features may not be drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

The present invention benefits from an extensive series of investigations directed to the engineering of source/drain extensions having shallow depths. The examination of simulated dopant profiles, generated for various combinations of implantation energies and implantation tilt angles, lead to the realization of the multi-step implantation process of the present invention. The use of a multi-step implantation process of the present invention affords the necessary degrees of freedom to fabricate source/drain extensions having shallow depths and abrupt borders while still overlapping the gate. Moreover, this process can be modified so as to continuously adjust the dimensions of the source/drain extension as other components of the semiconductor device are scaled down.

Figure 1A:
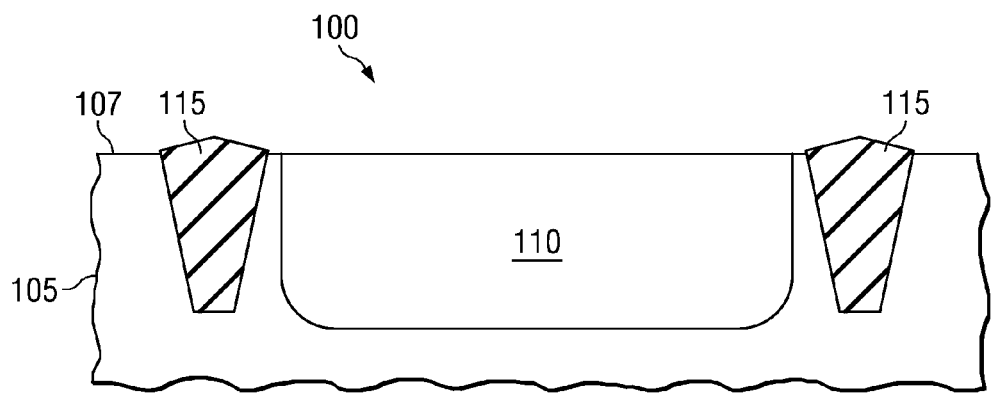
FIGS. 1A to 1F illustrate sectional views of selected steps in a process for fabricating a metal oxide semiconductor (MOS) device according to the principles of the present invention.

One embodiment of the present invention is presented in FIGS. 1A to 1F, which illustrate sectional views of selected steps, at various stages of manufacture, of a process for fabricating a MOS semiconductor device 100 according to the principles of the present invention. Turning first to FIG. 1A, depicted is a partial sectional view of a conventionally formed semiconductor substrate 105 that has a top surface 107. The substrate 105 can be made of conventional materials, such as silicon. A doped well 110 can be formed in the substrate to form a p-type or n-type well. For example, an n-type well 110 is preferably a silicon substrate 105 doped with an n-type dopant, such as arsenic ($As^+$) or phosphorus ($P^+$) using conventional procedures. A p-type well 110 is preferably a silicon substrate doped with a p-type dopant like boron ($B^+$). Also shown are conventionally-formed shallow trench isolation structures 115, which serve to electrically isolate the MOS device 100 from other adjacent devices formed in the substrate 105.

Figure 1B:
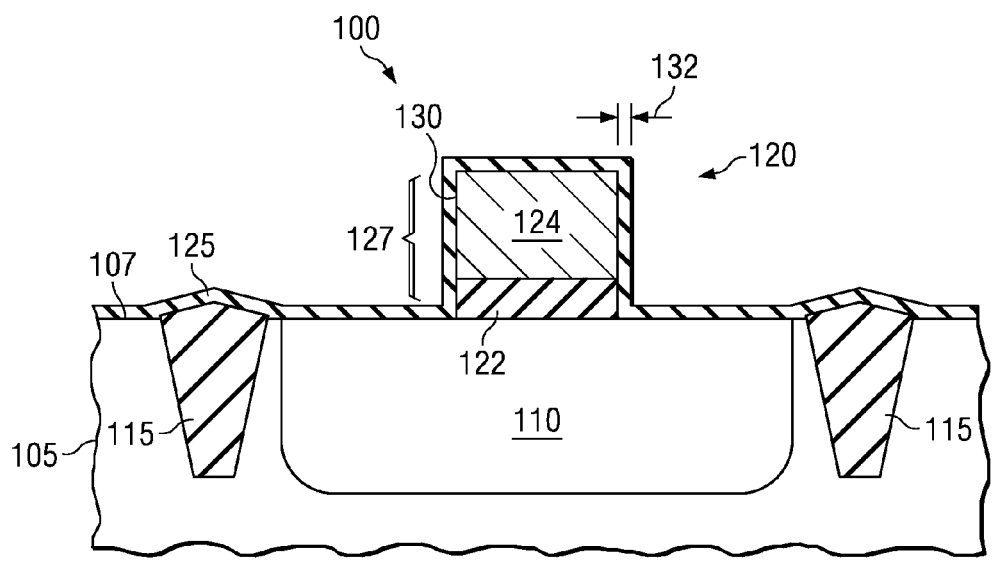

Turning now to FIG. 1B, illustrated is the MOS device 100 after forming a gate 120 structure on the substrate 105, using conventional materials, deposition and photolithography techniques. The gate 120 preferably includes a gate insulating layer 122 and gate electrode 124. In some embodiments, the insulating layer 122 comprises a dielectric material, such as silicon dioxide. Suitable materials for the gate electrode 124 include doped polysilicon, metal, or combinations thereof. The shallow trench isolation structure 115 and gate 120, by acting as masks, can advantageously define portions of the substrate 105 or well 110 to be exposed to dopants during the formation of the source/drain extension, as further discussed below.

As also illustrated in FIG. 1B, in some cases, it is desirable to deposit an optional thin conformal dielectric layer 125, over the substrate 105 and gate 120 before forming source/drain extensions. Thus, a portion 127 of the dielectric layer 125 is on one or more sidewalls 130 of the gate 120. Preferably, the conformal dielectric layer 125 is an oxide layer having a thickness 132 of less than about 100 Angstroms, and more preferably less than about 10 Angstroms.

Figure 1C:
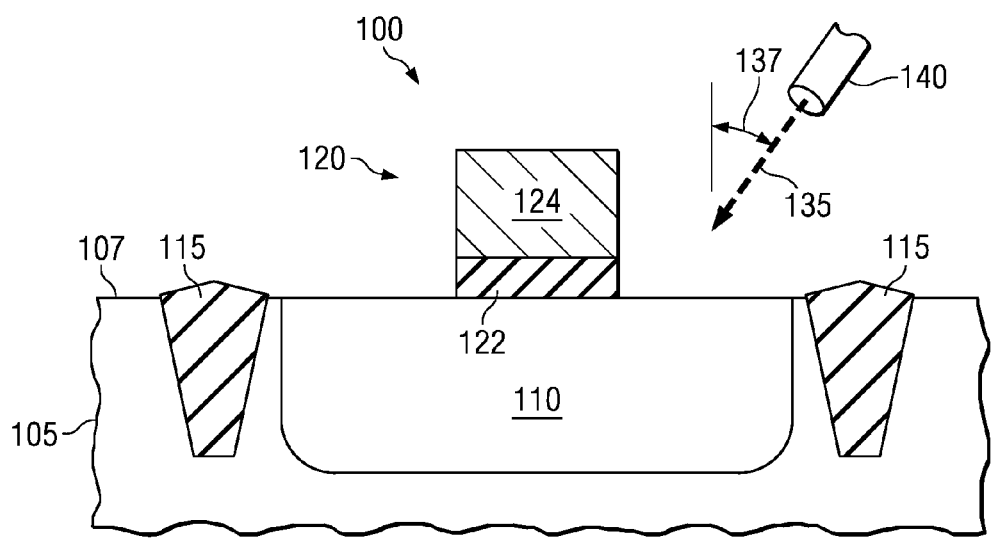
Figure 1D:
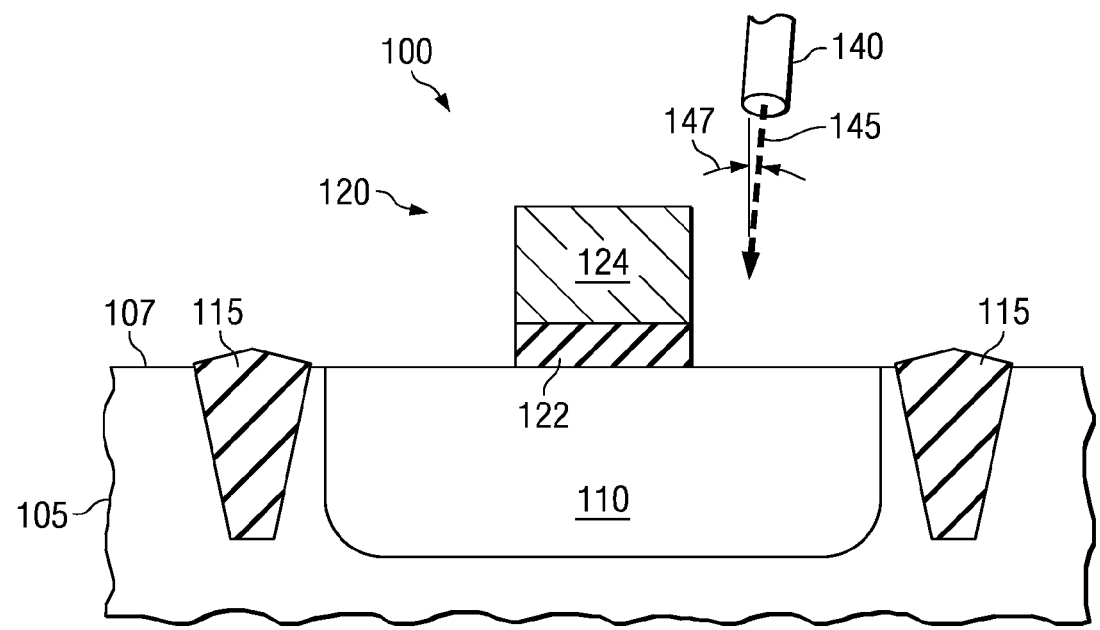

FIGS. 1C and 1D depict an exemplary multi-step implantation process of the present invention used in forming source/drain extensions. For clarity, the implantations to form a single source/drain extension are shown. It would be apparent to one skilled in the art that pairs of source/drain extensions could be formed simultaneously or sequentially using this process. As illustrated in FIG. 1C, one component of forming source/drain extensions involves an abnormal-angled dopant implantation (a beam of dopants represented by arrow 135) using a first acceleration energy and tilt angle 137 of greater than about zero degrees. The term abnormal-angled, refers to the dopant implantation source 140 being located substantially different from a direction normal to the top surface 107 of the substrate 105. Preferably, the tilt angle 137 is less than about 20 degrees, because this avoids undesirable shadow mask effects associated with a substrate 105 densely packed with other device components. Shadow masking occurs when an angled dopant implantation is at least partially blocked by a device component, or partially constructed component, near the MOS device 100. Even more preferably, the tilt angle 137 ranges from between about 10 and about 20 degrees. In some instances, a tilt angle 137 of between about 10 and about 14 degrees is preferred, because this is conducive to the production of MOS devices 100 with a higher device packing density on the substrate 105. Of course, the abnormal-angled, dopant implantation can be done in a plurality of stages. In some preferred embodiments, for instance, the location of the implantation source 140 is moved symmetrically around the substrate 105 with a portion of the implantation done at each location. For example, the implantation source 140 could be moved to two or four location around the substrate 105 with one-half or one fourth of the implantation being done at each of the two or four locations, respectively.

As shown in FIG. 1D, another component of forming source/drain extensions involves a dopant implantation (a beam of the dopants being represented by arrows 145) using a second acceleration energy that is higher than the first acceleration energy of the dopant implantation 145. In some preferred embodiments, the acceleration energy of the abnormal-angled implantation 135 is less about 3000 eV, and the second acceleration energy is less than about 5000 eV.

Preferably, the dopant implantation 145 is done at a second tilt angle 147 that is less than the tilt angle 137 of the abnormal-angled dopant implantation 135. In some instances, for example, the second tilt angle 147 is about zero degrees. A tilt angle substantially equal to zero degrees can be achieved by situating the dopant implantation 145 substantially normal (e.g., second tilt angle 147 less than about ±1 degrees).

In some embodiments, the dopant implantation 145 is done before the abnormal-angled dopant implantation 135. More preferably, however, the abnormal-angled dopant implantation 135 is done before the dopant implantation 145. The latter process sequence is advantageous because the abnormal-angled dopant implantation 135 serves to disorder or amorphize the substrate surface 107 so that the higher energy dopant implantation 145 is less prone to result in excessive depths of dopant channeling into the substrate 105. Of course, in some cases, it may be desirable to also perform a pre-amorphization implant to amorphize the substrate surface 107 before forming the source/drain extension structure. As well understood by those skilled in the art, an amorphized surface is one that has lost its crystallinity and become substantially disordered.

Of course, the choice of dopant and the dose used depend on the type of MOS device 100 being produced and its intended use. For example, a positive channel metal oxide semiconductor (pMOS) transistor has a source/drain extension comprising p-type dopants such as $B^+$. Alternatively, a negative channel metal oxide semiconductor (nMOS) transistor has a source/drain extension comprising n-type dopants such as $P^+$ or $As^+$. Preferably, the abnormal-angled dopant implantation 135 and dopant implantation 145 use dopants of the same dopant type. However, the abnormal-angled implantation 135 and dopant implantation 145 can have a first and second dopant, respectively, where the second dopant has a different chemical composition than the first dopant. In some embodiments, for instances, the first dopant is $P^+$ and the second dopant is $As^+$. One of ordinary skill in the art would understand the appropriate doses of dopants to use.

Figure 1E:
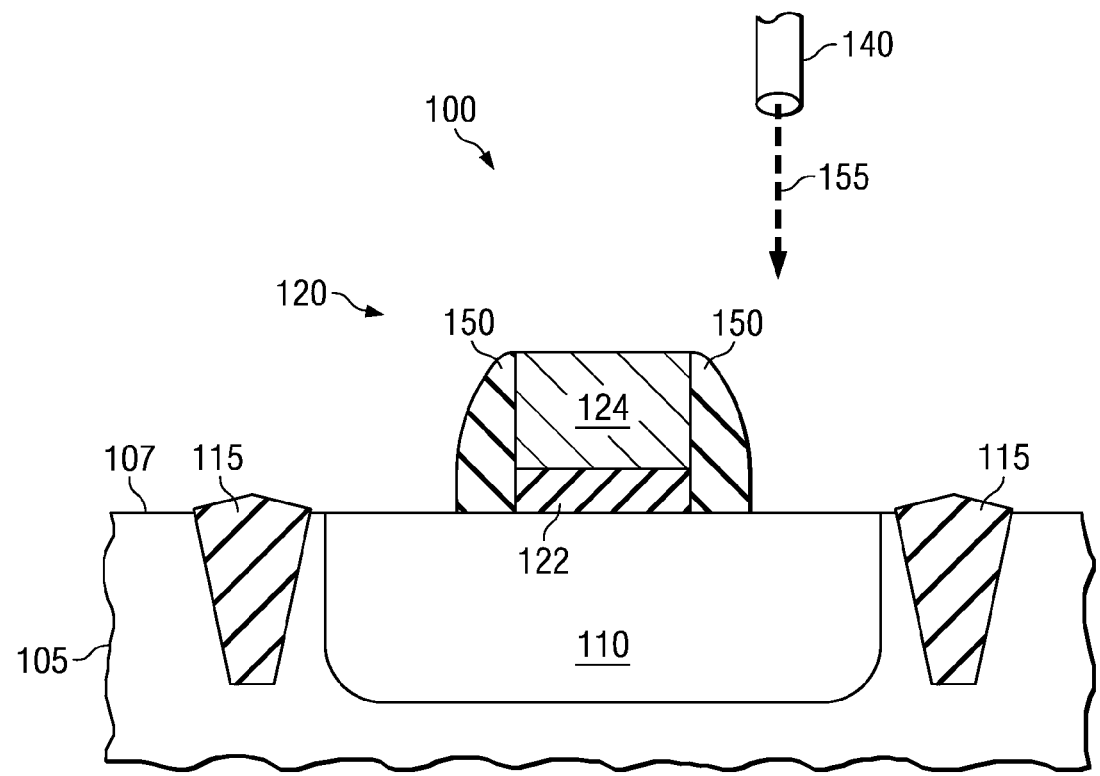

Turning now to FIG. 1E, illustrated is the partially completed MOS device 100 after forming sidewall spacers 150 on the gate sidewall 130, and implanting source/drain dopants (represented by arrow 155) in the substrate 105. The dopant dose and acceleration energy associated with the source/drain implantation 155 are substantially higher than that used in source/drain extension implantations 135, 145. For example, implanting the source/drain dopant 155 includes a conventional dose and acceleration energy of dopants 155, and a tilt angle of substantially zero degrees.

The multi-step source/drain extension implantations 135, 145 are done without the source/drain sidewall spacer 150 in place. Preferably, therefore, the source/drain dopant implantation 155 is done subsequent to the source/drain extension dopant implantation 135,145. In some cases, however, source/drain dopant implantation 155 is done before source/drain extension dopant implantation 135,145. In such embodiments, the sidewall spacer 150 is formed, and source/drain dopant implantation 155 is done as described above. Next, the side wall spacer 150 is removed and then the above-described source/drain extension dopant implantation 135,145 is performed. One of ordinary skill in the art would understand how to incorporate alternative conventional processes for forming source/drain extension implantations 135,145 and source/drain dopant implantation 155 into the present invention.

Figure 1F:
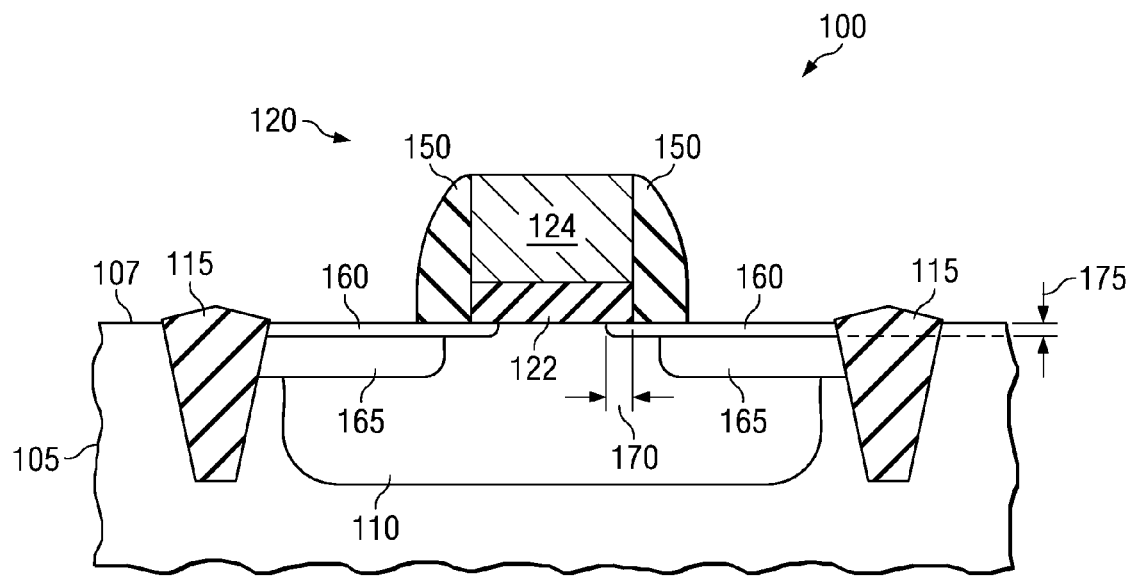

FIG. 1F illustrates the MOS device 100 after performing an ultrahigh high temperature (UHT) anneal of the substrate 105 to complete the formation of the source/drain extensions 160, and the source/drain structures 165. The UHT anneal serves to repair the substrate surface 107 and diffuse dopants to a limited extent into the substrate 105. Thus, the UHT anneal and above-described multi-step implantation process cooperate to result in a portion 170 of the source/drain extension 160 being under the gate 120. In preferred embodiments, the UHT anneal comprises heating to a temperature of greater than about 1150° C. for a time of less than 1000 ms. More preferably, the UHT anneal comprises heating to a temperature between about 1200° C. and about 1400° C. for a time of less than 100 ms, and more preferably, less than about 5 ms.

Preferably, a single UHT anneal is performed after each of the multi-step implantations 135, 145 for the source/drain extension 160 and after implanting the dopants 155 for the source/drain structure 165. In other embodiments, however, the UHT anneal is done after forming the source/drain structure 165. In the latter case, the source/drain structure 165 is made by forming the sidewall spacer 150 and implanting source/drain dopants 155 substantially as described above, followed by a thermal anneal. The thermal anneal to form the source/drain structure 165 could be an UHT anneal, similar to that described above. Alternatively, the thermal anneal to form the source/drain structure 165 could be a rapid thermal anneal or spike anneal, where heating is to a temperature up to about 1100° C. for more than 1 second. After the thermal anneal to form the source/drain structure 165, the sidewall spacer 150 is removed, and the above-described multi-step implantation 135, 145 and UHT anneal is performed to form the source/drain extension 160.

The abnormal-angled dopant implantation 135 and dopant implantation 145, in cooperation with the UHT anneal, offer at least two degrees of freedom for source/drain extension engineering. The abnormal-angled dopant implantation 135 governs chiefly the extent to which the source/drain extension is under the gate. The dopant implantation 145 governs mainly the depth 175 of the source/drain extension 160 in the substrate 105. Additional dopant implantation steps can be added to the multi-step implantation process, to add additional degrees of freedom and thereby refine the formation of the source/drain extension 160. As an example, forming the source/drain extension 160 can include third and fourth dopant implantations using acceleration energies and tilt angles that are the same or intermediate between the energies and tilt angles used for the abnormal-angled dopant implantation 135 and dopant implantation 145.

Figure 2:
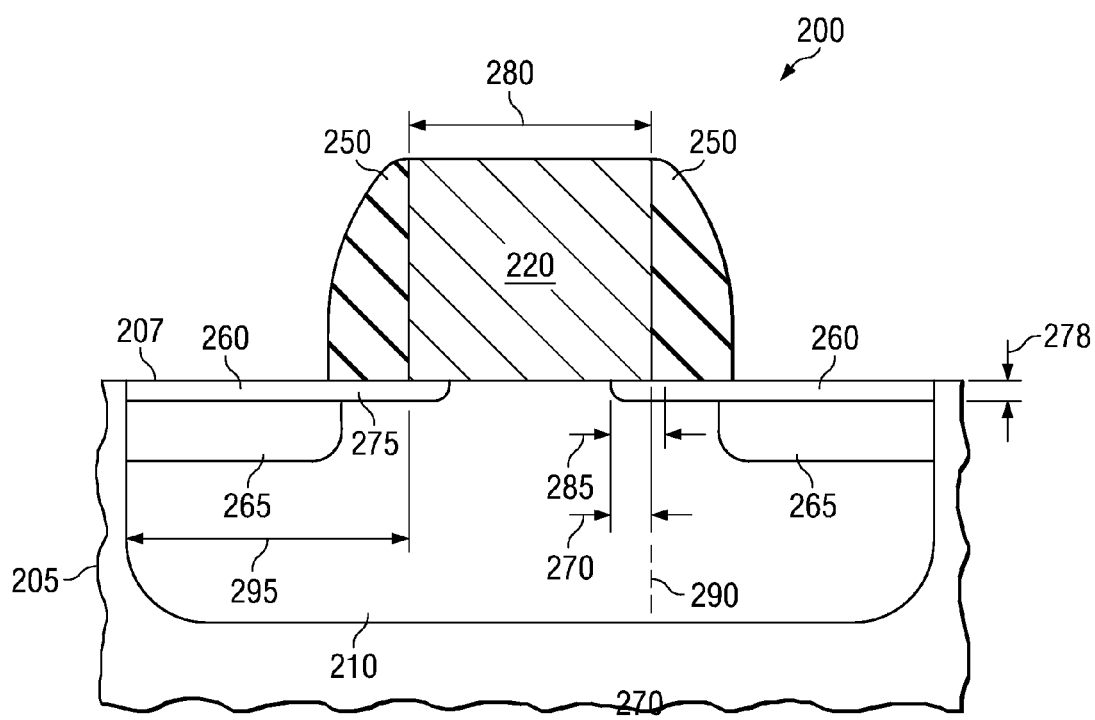
FIG. 2 illustrates a sectional view of an exemplary metal oxide semiconductor (MOS) device of the present invention.

Another embodiment of the present invention is illustrated in FIG. 2, a metal oxide semiconductor (MOS) device 200. Analogous reference numbers are used to depict similar structure to that presented in FIGS. 1A-1F. Any of the above-described embodiments of methods can be used to fabricate the MOS device 200. In some preferred embodiments, the MOS device 200 can be a PMOS transistor device or an NMOS transistor device.

The MOS device 200 includes a substrate 205 having a top surface 207, a gate structure 220 on the top surface 207, and a source/drain extension 260 in the silicon substrate 205. A portion 270 of the source/drain extension 260 is under the gate 220 and the source/drain extension 260 has a border 275 at a depth 278 of about 25 nanometers or less from the top surface 207.

The border 275 of the source/drain extension 260 is defined as the location where there is an abrupt change in the concentration of dopants comprising the source/drain extension 260. Those skilled in the art are familiar with the term abruptness. Abruptness is defined in terms of a distance interval one must travel through the source/drain extension 260 to realize a one-decade decrease in the dopant concentration. A common convention is to define the one-decade decrease in dopant concentration for the dopant concentration range of about $1 \times 10^{19}$ atoms/cm$^3$ to about $1 \times 10^{18}$ atoms/cm$^3$. Of course, the one-decade decrease could be defined for a different concentration range of dopant, depending on total dopant concentration in source/drain extension 260. For the purposes of the present invention, an abrupt change occurs when the abruptness is less than about 30 Angstroms/decade. More preferably, the abruptness is less than about 15 Angstroms/decade The multi-step implantation process and UHT anneal imparts the source/drain extensions 260 with several beneficial structural features. For instance, the depth 278 of the border 275 can be continuously varied from 25 nanometers to about 1 nanometer. This allows the source/drain extension 260 to be constructed to suit a wide range of gate lengths 280 (e.g., lengths 280 from about 100 nanometers to about 10 nanometers). Moreover, independent of the source/drain extension's depth 278, the portion 270 of the source/drain extension 260 under the gate structure 220 can be continuously adjusted to have an overlap 285 with an outer perimeter 290 of the gate structure 220 ranging from about 10 Angstroms to about 70 Angstroms.

As discussed in the context of the exemplary method presented in FIGS. 1A-1F, the source/drain extension 260 can include a first dopant and a second dopant corresponding to the abnormal-angled dopant implantation 135 and dopant implantation 145, respectively. While first and second dopants are of a same dopant type, they can have the same or different chemical compositions. In certain embodiments, a ratio of the first to the second dopant in the 270 portion the extension 260 under the gate 220 is greater than a second ratio of the first to the second dopant in a second portion 295 of the extension 260 not under the gate 220.

Of course, preferred embodiments of the MOS device 200 include a doped well 210, source/drain structures 265 and sidewall spacers 250. These structures can be formed as described above, or using other conventional procedures well known to those skilled in the art.

Figure 3A:
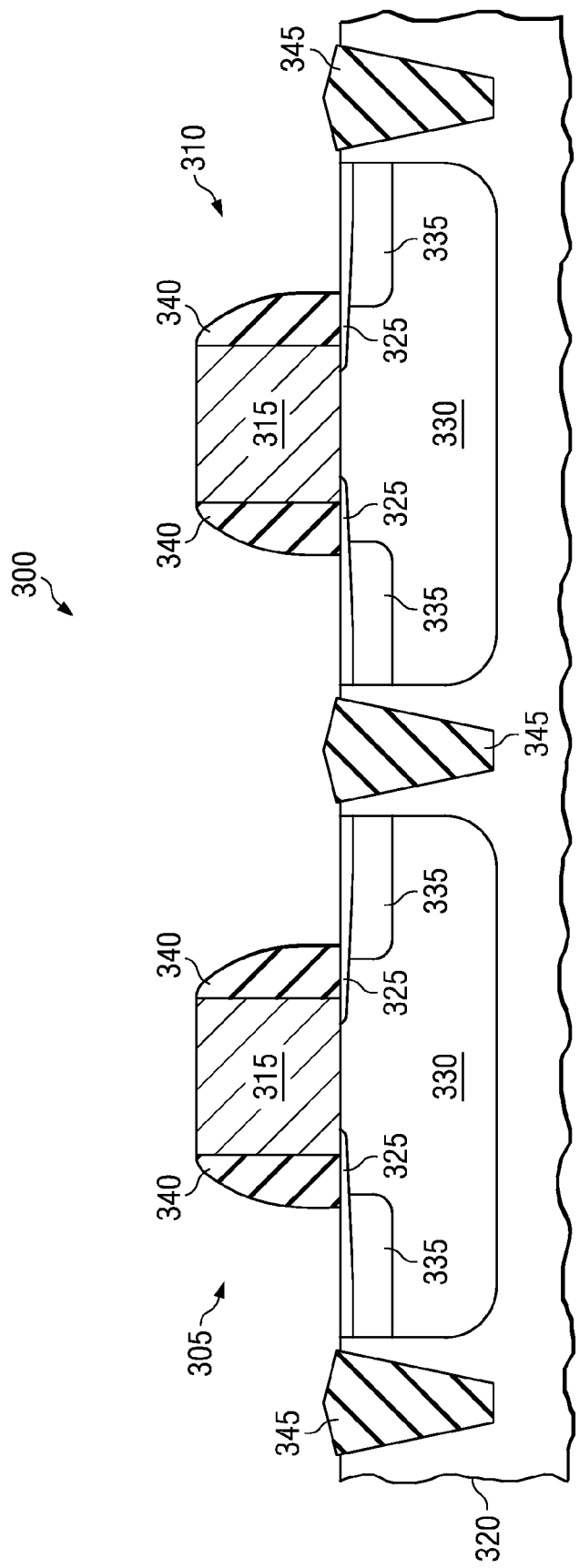
FIGS. 3A and 3B illustrate sectional views of selected steps in a method of manufacturing integrated circuit according to the principles of the present invention.
Figure 3B:
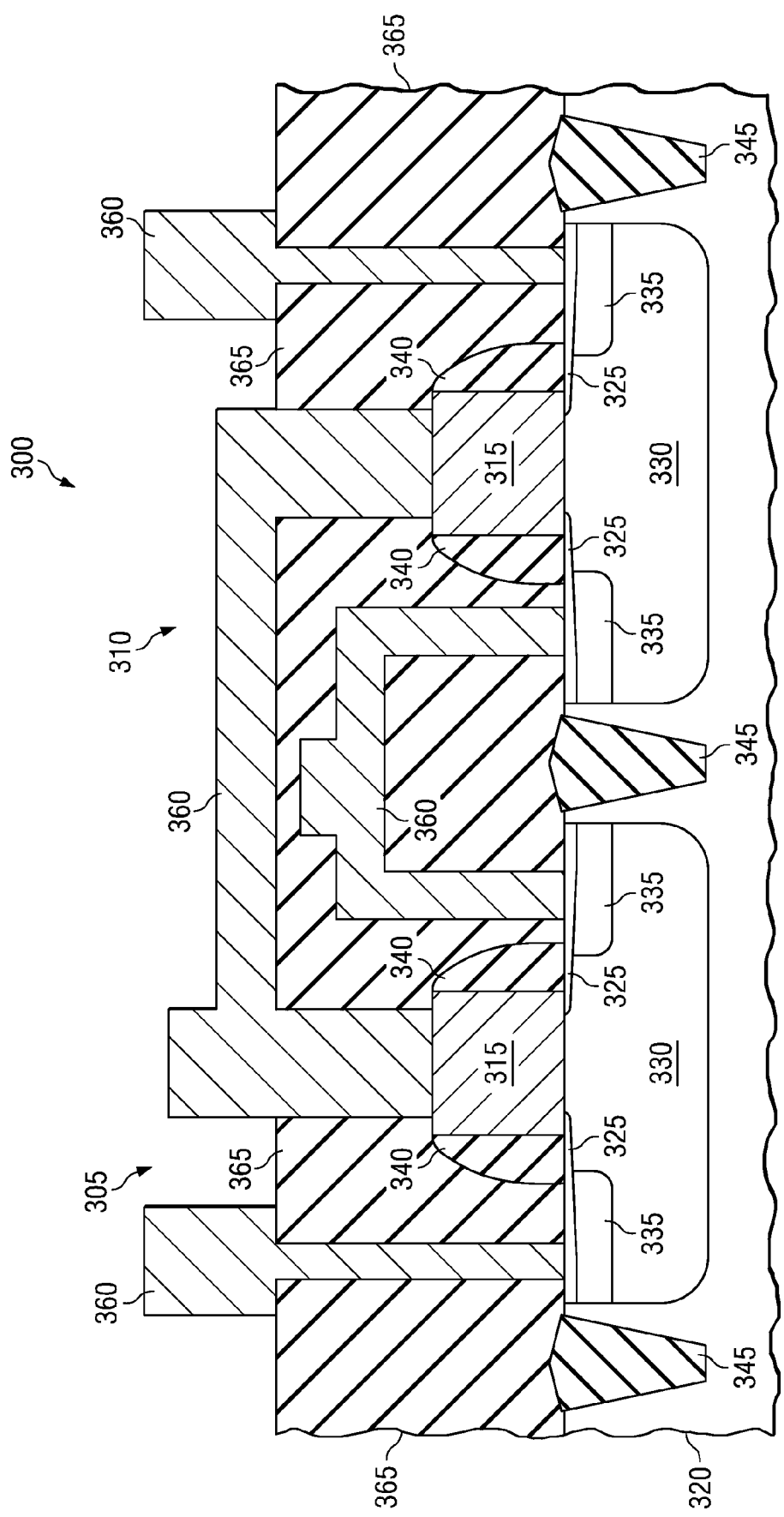

Another aspect of the present invention is a method of manufacturing an integrated circuit. FIGS. 3A and 3B illustrate Sectional views of selected steps, at various stages of manufacture of an exemplary an integrated circuit 300. Turning to FIG. 3A, illustrated is a partial completed integrated circuit 300, after forming MOS transistors 305, 310. In some embodiments, the transistors 305, 310 are PMOS and NMOS transistors, respectively, in a complementary metal oxide semiconductor (CMOS) device. The transistors 305, 310 can form part of logic, memory or other conventional circuits 300.

Any of the above-described embodiments of the processes for fabricating a MOS device according to the present invention, such as illustrated in FIGS. 1A-1F and FIG. 2, can be used to form the MOS transistors 305, 310. For instance, forming the MOS transistors 305, 310 includes forming gate structures 315 on a substrate 320 and forming source/drain extensions 325 in the substrate 320. The source/drain extensions 325 are formed via a multi-step implantation scheme, followed by a UHT anneal substantially as described above. Other transistor components, such as wells 330, source/drain structures 335, sidewall spacers 340 and shallow trench isolation structures 345 can be fabricated using process described above, or by other conventional processes.

The ability to fabricate transistors 305, 310, and in particular source/drain extensions 325, according to the present invention permits a higher packing density of device structures because components of the transistors can be scaled down. It is still desirable, however, to maintain a certain minimum separation between transistors 305, 310 so as to avoid detrimental shadow masks effects, as previously discussed above.

Turning to FIG. 3B, illustrated is the integrated circuit 300 after interconnecting metal lines 360 on one or more insulating layer 365 located over the MOS transistors 305, 310 and interconnecting the MOS transistors 305, 310 to form an operative integrated circuit 300.

Although the present invention has been described in detail, one of ordinary skill in the art should understand that they can make various changes, substitutions and alterations herein without departing from the scope of the invention.

What is claimed is:

1. A process for fabricating a metal oxide semiconductor (MOS) device, comprising:
   forming a gate on a substrate;
   forming a source/drain extension in said substrate comprising:
      a first dopant implantation using a first acceleration energy and a first tilt angle of greater than about zero degrees; and
      a second dopant implantation using a second acceleration energy that is higher than said first acceleration energy; and
   forming a source/drain in said substrate comprising:
      forming a sidewall spacer on a side wall of said gate; and
      implanting a source/drain dopant in said substrate with a third dopant implantation.

2. The method as recited in claim 1, wherein said first tilt angle is less than 20 degrees.

3. The method as recited in claim 1, wherein said second dopant implantation further includes a second tilt angle that is less than said first tilt angle.

4. The method as recited in claim 3, wherein said second tilt angle is about zero degrees.

5. The method as recited in claim 3, wherein said second tilt angle is less than about ±1 degrees from normal.

6. The method as recited in claim 1, wherein said first dopant implantation and said second dopant implantation further includes a first and second dopant, respectively, wherein said first and second dopant are a same dopant type.

7. The method as recited in claim 1, wherein said first acceleration energy is less than about 3000 eV and said second acceleration energy is less than about 5000 eV.

8. The method as recited in claim 1, wherein said step of forming said source/drain is subsequent to said step of forming said source/drain extension.

9. The method as recited in claim 1, further includes a preamorphization implant performed before forming said source/drain extension.

10. The method as recited in claim 1, further including performing an ultrahigh temperature anneal of said substrate, wherein a portion of said source/drain extension is under said gate and wherein said ultrahigh temperature anneal is performed after said implanting dopants for said source/drain structure.

11. The method as recited in claim 1, further including performing an ultrahigh temperature anneal of said substrate, wherein a portion of said source/drain extension is under said gate and wherein said ultrahigh temperature anneal includes a temperature of greater than about 1150° C. for a time of less than 100 ms.

12. The method as recited in claim 1, wherein said forming said source/drain extension further includes additional dopant implantation steps.

13. A method of manufacturing an integrated circuit comprising:
   forming MOS transistors including:
      forming gates on a substrate;
      forming source/drain extensions in said substrate by a multi-step implantation scheme comprising:
         a first dopant implantation using a first acceleration energy and tilt angle of greater than zero degrees; and
         a second dopant implantation using a second acceleration energy that is higher than said first acceleration energy;

forming a sidewall spacer on a side wall of said gates;
implanting a source/drain dopant in said substrate with a third dopant implantation; and
performing an ultrahigh high temperature anneal of said substrate,
wherein a portion of said source/drain extensions are under each of said gates; and interconnecting metal lines on one of more insulating layers located over said MOS transistors and interconnecting said MOS transistors to form an operative integrated circuit.

* * * * *